(12) United States Patent
Wu et al.

(10) Patent No.: US 9,567,218 B2
(45) Date of Patent: Feb. 14, 2017

(54) REACTOR AND METHOD FOR GROWING CARBON NANOTUBE USING THE SAME

(71) Applicants: Tsinghua University, Beijing (CN); HON HAI PRECISION INDUSTRY CO., LTD., New Taipei (TW)

(72) Inventors: Yang Wu, Beijing (CN); Peng Liu, Beijing (CN); Yang Wei, Beijing (CN); Jia-Ping Wang, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 17 days.

(21) Appl. No.: 13/870,140

(22) Filed: Apr. 25, 2013

(65) Prior Publication Data

US 2014/0186547 A1 Jul. 3, 2014

(30) Foreign Application Priority Data

Dec. 29, 2012 (CN) .......................... 2012 1 0587686

(51) Int. Cl.
*B01J 15/00* (2006.01)
*B01J 19/18* (2006.01)
(Continued)

(52) U.S. Cl.
CPC .......... *C01B 31/0226* (2013.01); *B01J 15/005* (2013.01); *B01J 19/1812* (2013.01);
(Continued)

(58) Field of Classification Search
CPC ......... B01J 20/205; B01J 21/185; B01J 35/10; B01J 15/005; B01J 19/2415; B01J 19/2485; B01J 19/2495; B01J 2219/00132; B01J 2219/00135; B01J 35/002–35/0093; B01J 35/06–35/065; B01J 23/74–23/755; B82Y 40/00; B82Y 30/00; C01B 31/0206; C01B 31/022; C01B 31/0226; C01B 31/0223; C01B 31/0253; C01B 31/0273; C01B 2202/00–2202/10; C01B 2202/20–2202/36; C01B 2235/5288; C04B 2235/5288; C04B 2235/614; C23C 16/46; C23C 16/26; G11C 13/025; B82B 3/0004; B82B 3/0038; B82B 3/0095; D01F 9/127; D01F 9/133; D04H 1/4242; D04H 1/76; H01G 11/22–11/36; H01G 11/32–11/38; H01J 23/02–23/033; H01L 51/0046–51/0049; Y10S 977/742–977/752; Y10S 977/847; D06M 2101/40; D10B 2101/122

(Continued)

(56) References Cited

U.S. PATENT DOCUMENTS 6,835,366 B1 * 12/2004 Margrave et al. ......... 423/447.1
8,057,778 B2   11/2011 Feng et al.
(Continued)

FOREIGN PATENT DOCUMENTS

CN    1931714       3/2007
CN    102092704     6/2011
WO    WO2005075340  8/2005

*Primary Examiner* — Jeffrie R Lund
*Assistant Examiner* — Stanislav Antolin
(74) *Attorney, Agent, or Firm* — Zhigang Ma

(57) ABSTRACT

A reactor includes a reactor chamber and a substrate. The reactor chamber having an inlet and an outlet. The hollow structure is received in the reactor chamber, wherein the hollow structure includes a sidewall, a bottom, and a opening opposite to the bottom, the sidewall defines a number of
(Continued)

apertures, gases in the reactor chamber flow penetrate the hollow structure through the number of apertures.

15 Claims, 12 Drawing Sheets

(51) Int. Cl.
*B01J 19/24* (2006.01)
*C01B 31/02* (2006.01)
*C23C 14/06* (2006.01)
*C23C 14/54* (2006.01)
*C23C 16/26* (2006.01)
*C23C 16/46* (2006.01)

(52) U.S. Cl.
CPC ....... *B01J 19/2415* (2013.01); *B01J 19/2485* (2013.01); *B01J 19/2495* (2013.01); *C01B 31/022* (2013.01); *C01B 31/0233* (2013.01); *C23C 14/0605* (2013.01); *C23C 14/541* (2013.01); *C23C 16/26* (2013.01); *C23C 16/46* (2013.01); *B01J 2219/00132* (2013.01); *B01J 2219/00135* (2013.01)

(58) Field of Classification Search
USPC ..... 118/715, 724, 725; 417/122, 249.1, 545; 428/292.1; 997/700, 742, 750, 843, 890, 997/902
See application file for complete search history.

(56) References Cited

U.S. PATENT DOCUMENTS

| | | | |
|---|---|---|---|
| 2003/0091825 A1* | 5/2003 | Shiffler et al. | 428/408 |
| 2005/0170089 A1* | 8/2005 | Lashmore et al. | 427/248.1 |
| 2005/0183663 A1* | 8/2005 | Cheng et al. | 118/715 |
| 2006/0231381 A1* | 10/2006 | Jensen et al. | 204/157.47 |
| 2006/0269669 A1* | 11/2006 | Jiang et al. | 427/249.1 |
| 2007/0116634 A1 | 5/2007 | Ho | |
| 2007/0224104 A1* | 9/2007 | Kim | 423/445 B |
| 2007/0248758 A1* | 10/2007 | Ward et al. | 427/271 |
| 2008/0170982 A1* | 7/2008 | Zhang et al. | 423/447.3 |
| 2009/0042455 A1* | 2/2009 | Mann | H01R 4/58 439/874 |
| 2009/0068461 A1* | 3/2009 | Reneker et al. | 428/366 |
| 2009/0277897 A1* | 11/2009 | Lashmore et al. | 219/544 |
| 2010/0122980 A1* | 5/2010 | Wang | H05B 3/145 219/553 |
| 2010/0178825 A1* | 7/2010 | Shah et al. | 442/188 |
| 2010/0260931 A1* | 10/2010 | Malecki et al. | 427/180 |
| 2010/0285300 A1* | 11/2010 | Wang et al. | 428/315.5 |
| 2010/0320141 A1* | 12/2010 | Hauge et al. | 210/500.22 |
| 2011/0140309 A1* | 6/2011 | Liu et al. | 264/400 |
| 2011/0142744 A1* | 6/2011 | Feng et al. | 423/447.1 |
| 2011/0156302 A1* | 6/2011 | Jiang et al. | 264/165 |
| 2012/0205834 A1 | 8/2012 | Lemaire et al. | |
| 2014/0186256 A1* | 7/2014 | Wu et al. | 423/447.3 |
| 2014/0186546 A1* | 7/2014 | Wu et al. | 427/545 |

\* cited by examiner

US 9,567,218 B2

REACTOR AND METHOD FOR GROWING CARBON NANOTUBE USING THE SAME

CROSS-REFERENCE TO RELATED APPLICATIONS

This application claims all benefits accruing under 35 U.S.C. §119 from China Patent Application 201210587686.X, filed on Dec. 29, 2012 in the China Intellectual Property Office, the disclosure of which is incorporated herein by reference.

BACKGROUND

1. Technical Field

The present disclosure relates to reactor and a method for growing carbon nanotubes using the reactor.

2. Description of the Related Art

Carbon nanotubes (CNT) are very small tube-shaped structures, and have extremely high electrical conductivity, very small diameter, and a tip-surface area near the theoretical limit. Due to these and other properties, it has been suggested that CNTs can play an important role in fields such as microscopic electronics, field emission devices, thermal interface materials, etc. Recently, a research is focusing on how to use the CNT as substrate to grow new particles in the reactor.

However, because of the limitation of the CNT such as small diameter, it is difficult to utilize the CNT to grow particles as the substrate in the reactor.

What is needed, therefore, is providing a reactor that can overcome the above-described shortcomings

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
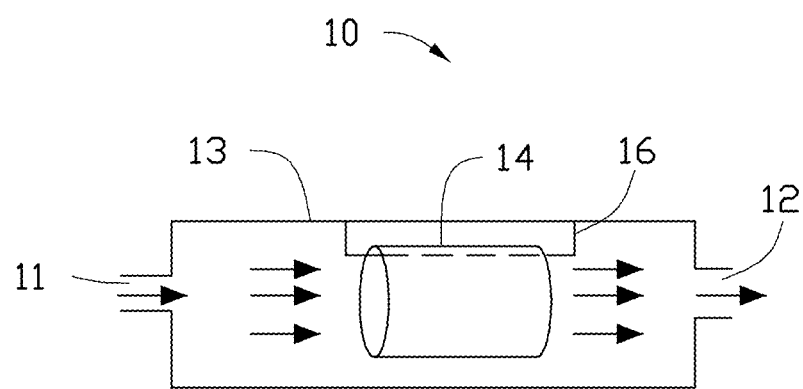
FIG. 1 is schematic view of one embodiment of a reactor.

Referring to FIG. 1, a reactor 10 of one embodiment includes a reactor chamber 13, a substrate 14, and a support 16. The substrate 14 is suspended and fixed in the reactor chamber 13 through the support 16.

The reactor chamber 13 receives the substrate 14 therein. The reactor chamber 13 has an inlet 11 and an outlet 12. The inlet 11 is configured for introducing a carbon-containing gas into the reactor chamber 13, thus producing (i.e., acting as a source of) carbon atoms for growing the carbon nanotube film (not shown). The outlet 12 is configured for allowing an exhaust gas to be evacuated/discharged therefrom. In one embodiment, the inlet 11 and the outlet 12 are located at opposite sidewalls of the reactor chamber 13, and the carbon-containing gas can flow from the inlet 11 towards the outlet 12 along a direct path, and thus the exhaust gas can be discharged timely.

The reactor chamber 13 may have a circular, elliptic, triangular, rectangular, other regular polygonal or irregular polygonal profile in view of a cross section of the reactor chamber 13. The reactor chamber 13 may, usefully, be made of a material with a high temperature resistance and chemically stable performance. For example, the reactor chamber 13 may, advantageously, be made of quartz, ceramic, stainless steel or the like. In the present embodiment, the reactor chamber 13 is in a shape of tube, and has a circular cross section. An inner radius of the reactor chamber 13 can range from about 1 cm to about 20 cm. In one embodiment, the inner radius of the reactor chamber 13 ranges from about 2.5 centimeters to about 10 cm. Thus the substrate 14 can be easily received into the reactor chamber 13, and firmly fixed in the reactor chamber 13. A length of the reactor chamber 13 can range from about 2 cm to about 50 cm. In one embodiment, the length of the reactor chamber 13 is about 20 cm, and the inner radius of the reactor chamber 13 is about 2.5 cm.

Figure 2:
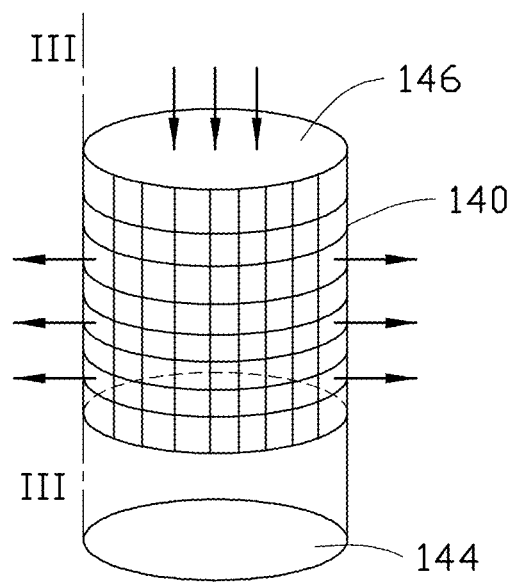
FIG. 2 shows a schematic view of a substrate in the reactor of FIG. 1.

Further referring to FIG. 2, the substrate 14 is received in the reactor chamber 13, and spaced from the inlet 11 and the outlet 12. The substrate 14 is a hollow structure. In one embodiment, the substrate 14 is in a shape of bucket extending along a direction from the inlet 11 to the outlet 12. A cross section of the substrate 14 can be circular, elliptic, triangular, rectangular, or other irregular shape. In one embodiment, the cross section of the substrate 14 is circular. The substrate 14 includes a sidewall 140, a bottom 144, and defines an opening 146 faced to the inlet 11. Thus the substrate 14 forms a semi-closed structure. Gases are introduced from the inlet 11 and flows into the substrate 14 through the opening 146. An outer diameter of the substrate 14 is smaller than an inner diameter of the reactor chamber 13, thus the substrate 14 can be received into the reactor chamber 13. The outer diameter of the substrate 14 can range from about 0.9 cm to about 45 cm. In one embodiment, the outer diameter of the substrate 14 ranges from about 1 centimeters to about 15 cm. In one embodiment, the outer diameter of the substrate 14 is about 2 cm.

The substrate 14 is a hollow structure and suspended in the reactor chamber 13. The term "suspended" means that a portion of the sidewall 140 is spaced from the reactor chamber 13. The substrate 14 can be suspended in the reactor chamber 13 via the support 16. The support 16 can be fixed on the inner wall of the reactor chamber 13, and can maintain the structure under high temperature. The material of the support 16 can be metallic, such as gold, silver, or aluminum. The material of the support 16 can also be insulated material such as ceramic. In one embodiment, the support 16 is a semi-ring structure fixed on the inner wall of the reactor chamber 13, and the material of the support 16 is ceramic. The substrate 14 is hung on the support 16. It is to be understood that, the substrate 14 can also be directly attached on the inner wall of the reactor chamber 13. Thus the support 16 can be avoided.

The bottom 144 is used to seal the substrate 14, thus the gases will be reflected by the bottom 144 and changed to penetrate the sidewall 140 of the substrate 14. The shape of the bottom 144 can be selected according to the cross section of the substrate 14, ensuring that the bottom 144 can seal the substrate 14. A material of the bottom 144 can be metals such as gold, steel. The material of the bottom 144 can also be semiconductor such as quartz. The material of the bottom 144 can also be an insulated material such as ceramic. In one embodiment, the material of the bottom 144 is ceramic. In one embodiment, the bottom 144 is directly fixed on the inner wall of the reactor chamber 13.

Figure 3:
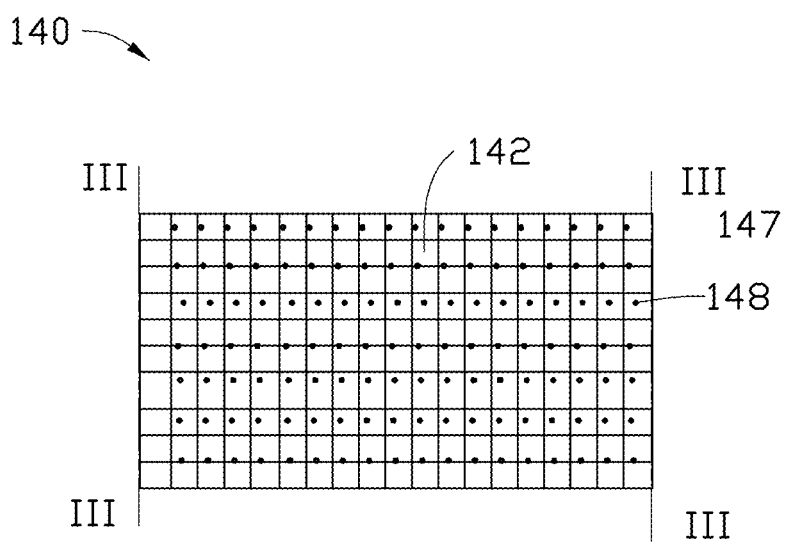
FIG. 3 shows a schematic, developed view, along a line III-III of FIG. 2.

Also referring to FIG. 3, the sidewall 140 includes carbon nanotube layer 147 and a plurality of catalyst particles 148 dispersed on the carbon nanotube layer 147. The carbon nanotube layer 147 defines a plurality of apertures 142. The plurality of apertures 142 forms a plurality of channels. The gases in the reactor chamber 13 can flow to penetrate through the plurality of apertures 142. The carbon nanotube layer 147 is a continuous and integrated structure. The carbon nanotube layer 147 includes a plurality of carbon nanotubes oriented substantially parallel with the surface of the carbon nanotube layer 147. The carbon nanotubes in the carbon nanotube layer 147 can be single-walled, double-walled, or multi-walled carbon nanotubes. The length and diameter of the carbon nanotubes can be selected according to need. The thickness of the carbon nanotube layer 147 can be in a range from about 1 nm to about 100 $\mu$m, for example, about 10 nm, 100 nm, 200 nm, 1 $\mu$m, 10 $\mu$m or 50 $\mu$m.

The carbon nanotube layer 147 forms a patterned structure. The patterned carbon nanotube layer 147 defines the plurality of apertures 142. The plurality of apertures 142 can be uniformly dispersed in the carbon nanotube layer 147. The plurality of apertures 142 extend throughout the carbon nanotube layer 147 along the thickness direction thereof. The aperture 142 can be a hole defined by several adjacent carbon nanotubes, or a gap defined by two substantially parallel carbon nanotubes and extending along axial direction of the carbon nanotubes. The size of the aperture 142 can be the diameter of the hole or width of the gap, and the average aperture size can be in a range from about 10 nm to about 500 $\mu$m, for example, about 50 nm, 100 nm, 500 nm, 1 $\mu$m, 10 $\mu$m, 80 $\mu$m or 120 $\mu$m. The hole-shaped apertures 142 and the gap-shaped apertures 142 can exist in the patterned carbon nanotube layer 147 at the same time. The sizes of the apertures 142 within the same carbon nanotube layer 147 can be different. In one embodiment, the sizes of the apertures 142 are in a range from about 10 nm to about 10 pm. A duty factor of the carbon nanotube layer 147 can be in a range from about 1:100 to about 100:1, for example, about 1:10, 1:2, 1:4, 4:1, 2:1 or 10:1. In one embodiment, the duty factor of the carbon nanotube layer 147 is in a range from about 1:4 to about 4:1.

The carbon nanotubes of the carbon nanotube layer 147 can be orderly arranged to form an ordered carbon nanotube structure or disorderly arranged to form a disordered carbon nanotube structure. The term 'disordered carbon nanotube structure' includes, but is not limited to, a structure where the carbon nanotubes are arranged along many different directions, and the aligning directions of the carbon nanotubes are random. The number of the carbon nanotubes arranged along each different direction can be substantially the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes in the carbon nanotube layer 147 are arranged to extend along the direction substantially parallel to the substrate 14 to obtain greater gases transmission. After being placed in the reactor chamber 13, the carbon nanotubes in the carbon nanotube layer 147 are arranged to extend along the direction substantially perpendicular to the flow direction of the gases. In one embodiment, all the carbon nanotubes in the carbon nanotube layer 147 are arranged to extend along the same direction. In another embodiment, some of the carbon nanotubes in the carbon nanotube layer 147 are arranged to extend along a first direction, and some of the carbon nanotubes in the carbon nanotube layer 147 are arranged to extend along a second direction, perpendicular to the first direction.

The carbon nanotube layer 147 is a free-standing structure. The term "free-standing structure" means that the carbon nanotube layer 147 can sustain the weight of itself when it is hoisted by a portion thereof without any significant damage to its structural integrity. Thus, the carbon nanotube layer 147 can be suspended by the support 16. The free-standing carbon nanotube layer 147 can be laid on the support 16 directly and easily. Thus the substrate 14 is also a free-standing structure. The plurality of catalyst particles 148 is uniformly dispersed in the free-standing carbon nanotube layer 147.

The carbon nanotube layer 147 can be a substantially pure structure of the carbon nanotubes, with few impurities and chemical functional groups. The carbon nanotube layer 147 can be a composite including a carbon nanotube matrix and non-carbon nanotube materials. The non-carbon nanotube materials can be graphite, graphene, silicon carbide, boron nitride, silicon nitride, silicon dioxide, diamond, amorphous carbon, metal carbides, metal oxides, or metal nitrides. The non-carbon nanotube materials can be coated on the carbon nanotubes of the carbon nanotube layer 147 or filled in the apertures 142. In one embodiment, the non-carbon nanotube materials are coated on the carbon nanotubes of the carbon nanotube layer 147 so the carbon nanotubes can have a greater diameter and the apertures 142 can a have smaller size. The non-carbon nanotube materials can be deposited on the carbon nanotubes of the carbon nanotube layer 147 by chemical vapor deposition or physical vapor deposition, such as sputtering.

Furthermore, the carbon nanotube layer 147 can be treated with an organic solvent after being placed on the epitaxial growth surface 101 so the carbon nanotube layer 147 can be firmly attached on the epitaxial growth surface 101. Specifically, the organic solvent can be applied to the entire surface of the carbon nanotube layer 147 or the entire carbon nanotube layer 147 can be immersed in an organic solvent. The organic solvent can be volatile, such as ethanol, methanol, acetone, dichloroethane, chloroform, or mixtures thereof. In one embodiment, the organic solvent is ethanol.

The carbon nanotube layer 147 can include at least one carbon nanotube film, at least one carbon nanotube wire, or a combination thereof. In one embodiment, the carbon nanotube layer 147 can include a single carbon nanotube film or two or more stacked carbon nanotube films. Thus, the thickness of the carbon nanotube layer 147 can be controlled by the number of the stacked carbon nanotube films. The number of the stacked carbon nanotube films can be in a range from about 2 to about 100, for example, about 10, 30, or 50. In one embodiment, the carbon nanotube layer 147 can include a layer of parallel and spaced carbon nanotube wires. The carbon nanotube layer 147 can also include a plurality of carbon nanotube wires crossed or weaved together to form a carbon nanotube net. The distance between two adjacent parallel and spaced carbon nanotube wires can be in a range from about 0.1 µm to about 200 µm. In one embodiment, the distance between two adjacent parallel and spaced carbon nanotube wires can be in a range from about 10 µm to about 100 µm. The size of the apertures 142 can be controlled by controlling the distance between two adjacent parallel and spaced carbon nanotube wires. The length of the gap between two adjacent parallel carbon nanotube wires can be equal to the length of the carbon nanotube wire. It is understood that any carbon nanotube structure described can be used in all embodiments.

Figure 4:
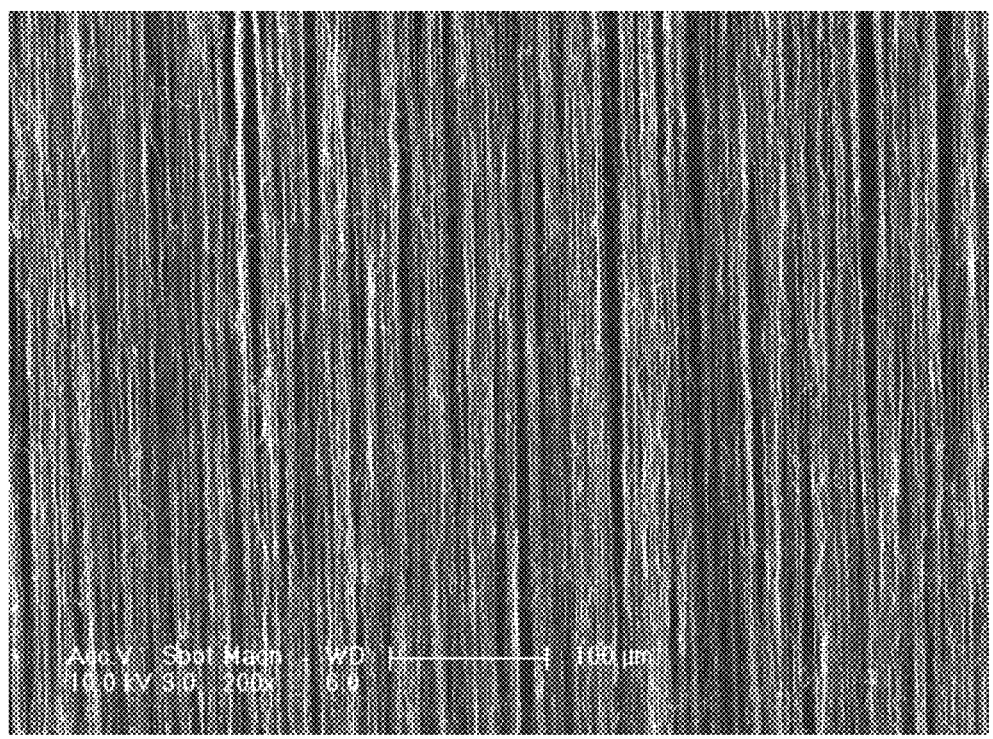
FIG. 4 shows a scanning electron microscope (SEM) image of one embodiment of a drawn carbon nanotube film.
Figure 5:
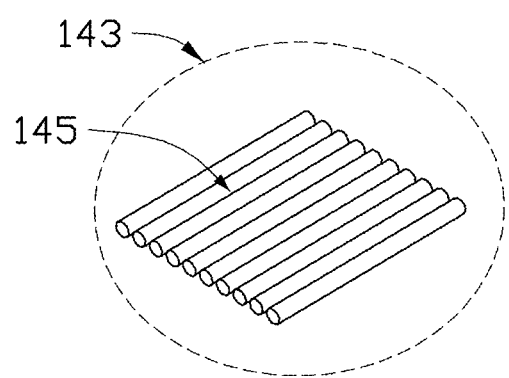
FIG. 5 shows a schematic view of one embodiment of a carbon nanotube segment of a drawn carbon nanotube film of FIG. 4.

In one embodiment, the carbon nanotube layer 147 includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIGS. 4 and 5, each drawn carbon nanotube film includes a plurality of successively oriented carbon nanotube segments 143 joined end-to-end by van der Waals attractive force therebetween. Each carbon nanotube segment 143 includes a plurality of carbon nanotubes 145 parallel to each other, and combined by van der Waals attractive force therebetween. Some variations can occur in the drawn carbon nanotube film. The carbon nanotubes 145 in the drawn carbon nanotube film are oriented along a preferred orientation. The drawn carbon nanotube film can be treated with an organic solvent to increase the mechanical strength and toughness, and reduce the coefficient of friction of the drawn carbon nanotube film. A thickness of the drawn carbon nanotube film can range from about 0.5 nm to about 100 µm. The drawn carbon nanotube film can be fixed in the reactor chamber 13 directly.

Figure 6:
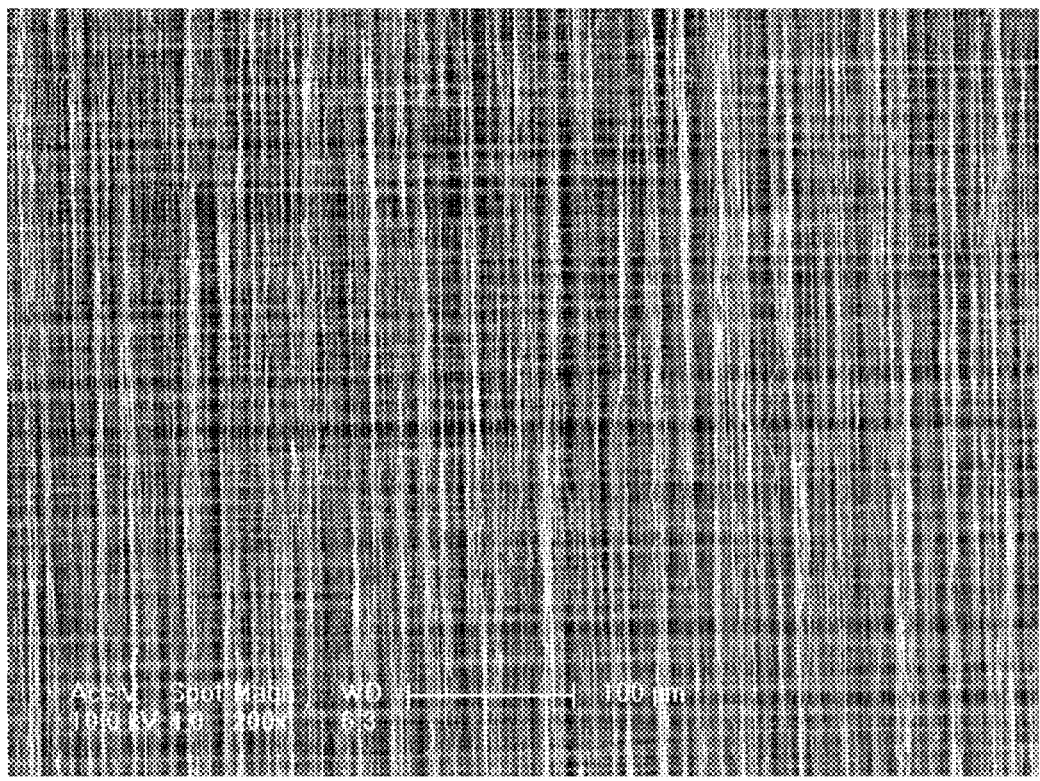
FIG. 6 shows a SEM image of one embodiment of a plurality of carbon nanotube films stacked in a cross order.

Referring to FIG. 6, the carbon nanotube layer 147 can include at least two stacked drawn carbon nanotube films. In other embodiments, the carbon nanotube layer 147 can include two or more coplanar carbon nanotube films, and each coplanar carbon nanotube film can include multiple layers. Additionally, if the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films are combined by the van der Waals attractive force therebetween. An angle between the aligned directions of the carbon nanotubes in two adjacent carbon nanotube films can range from about 0 degrees to about 90 degrees. If the angle between the aligned directions of the carbon nanotubes in adjacent stacked drawn carbon nanotube films is larger than 0 degrees, a plurality of micropores is defined by the carbon nanotube layer 147. Referring to FIG. 5, the carbon nanotube layer 147 shown with the angle between the aligned directions of the carbon nanotubes in adjacent stacked drawn carbon nanotube films is 90 degrees. Stacking the carbon nanotube films will also add to the structural integrity of the carbon nanotube layer 147, and the aggregation of the catalyst particles 148 can be avoided. Thus the catalyst particles 148 can be uniformly dispersed in the carbon nanotube layer 147, and can be fully reacted with the gases.

In another embodiment, the carbon nanotube layer 147 can include a pressed carbon nanotube film. The pressed carbon nanotube film can be a free-standing carbon nanotube film. The carbon nanotubes in the pressed carbon nanotube film are arranged along a same direction or arranged along different directions. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is about 0 degrees to approximately 15 degrees. The greater the pressure is applied, the smaller the angle is formed. If the carbon nanotubes in the pressed carbon nanotube film are arranged along different directions, the carbon nanotube layer 147 can be isotropic.

In another embodiment, the carbon nanotube layer 147 includes a flocculated carbon nanotube film. The flocculated carbon nanotube film can include a plurality of long, curved, disordered carbon nanotubes entangled with each other. Furthermore, the flocculated carbon nanotube film can be isotropic. The carbon nanotubes can be substantially uniformly dispersed in the carbon nanotube film. Adjacent carbon nanotubes are acted upon by van der Waals attractive force to form an entangled structure with micropores defined therein. It is understood that the flocculated carbon nanotube film is very porous. Sizes of the micropores can be less than 10 µm. The porous nature of the flocculated carbon nanotube film will increase the specific surface area of the carbon nanotube layer 147. Additionally, because the carbon nanotubes in the carbon nanotube layer 147 are entangled with each other, the carbon nanotube layer 147 employing the flocculated carbon nanotube film has excellent durability, and can be fashioned into desired shapes with a low risk to the integrity of the carbon nanotube layer 147. In some embodiments, the flocculated carbon nanotube film is a free-standing structure because the carbon nanotubes being entangled and adhered together by van der Waals attractive force therebetween.

Figure 7:
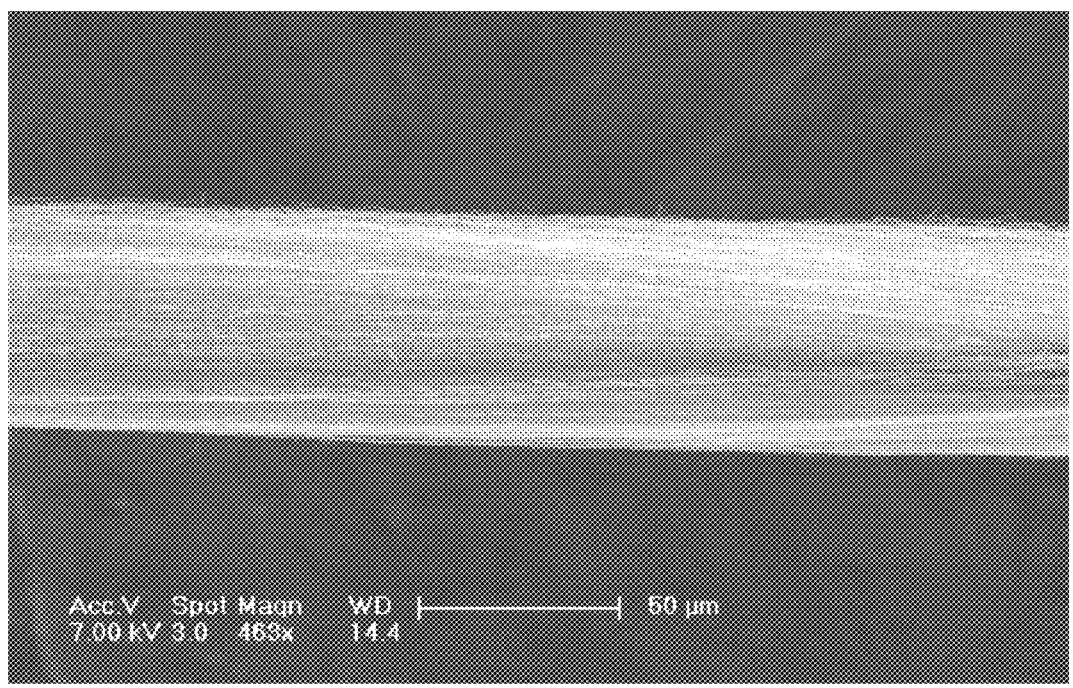
FIG. 7 shows a SEM image of one embodiment of an untwisted carbon nanotube wire.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes. Thus, the drawn carbon nanotube film will be shrunk into untwisted carbon nanotube wire. Referring to FIG. 7, the untwisted carbon nanotube wire includes a plurality of carbon nanotubes substantially oriented along a same direction (i.e., a direction along the length of the untwisted carbon nanotube wire). The carbon nanotubes are parallel to the axis of the untwisted carbon nanotube wire. Specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. Length of the untwisted carbon nanotube wire can be arbitrarily set as desired. A diameter of the untwisted carbon nanotube wire ranges from about 0.5 nm to about 100 μm.

Figure 8:
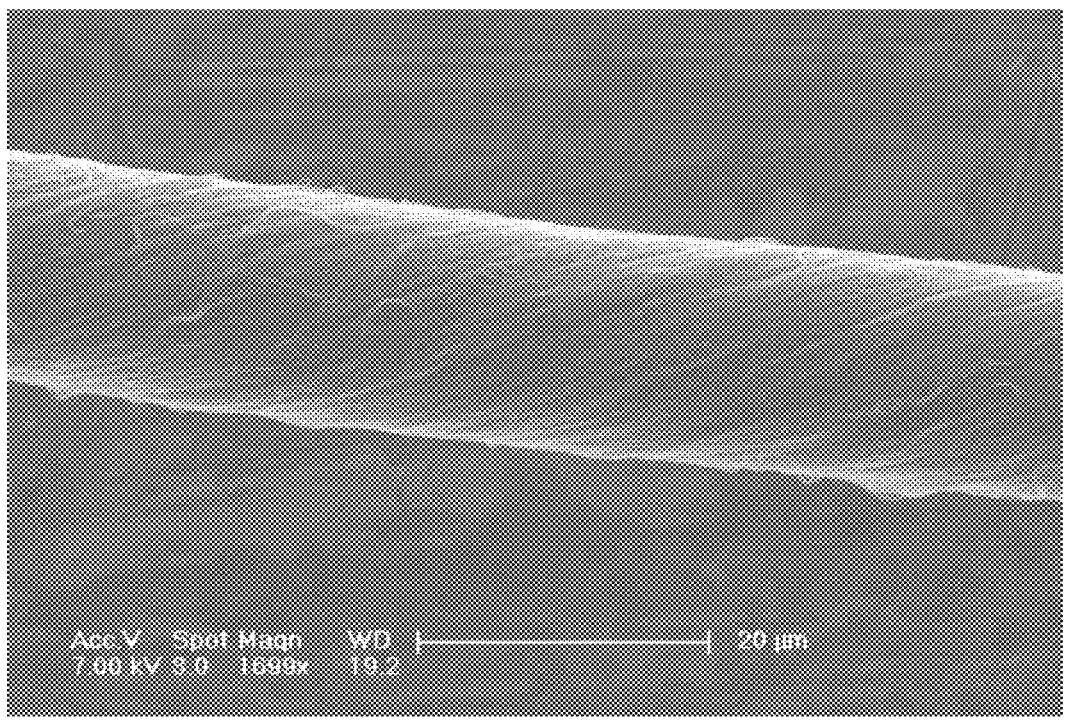
FIG. 8 shows a SEM image of one embodiment of a twisted carbon nanotube wire.

The twisted carbon nanotube wire can be formed by twisting a drawn carbon nanotube film using a mechanical force to turn the two ends of the drawn carbon nanotube film in opposite directions. Referring to FIG. 8, the twisted carbon nanotube wire includes a plurality of carbon nanotubes helically oriented around an axial direction of the twisted carbon nanotube wire. Specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. Length of the carbon nanotube wire can be set as desired. A diameter of the twisted carbon nanotube wire can be from about 0.5 nm to about 100 μm. Further, the twisted carbon nanotube wire can be treated with a volatile organic solvent after being twisted. After being soaked by the organic solvent, the adjacent paralleled carbon nanotubes in the twisted carbon nanotube wire will bundle together due to the surface tension of the organic solvent when the organic solvent volatilizes. The specific surface area of the twisted carbon nanotube wire will decrease, while the density and strength of the twisted carbon nanotube wire will be increased.

The plurality of catalyst particles 148 can be deposited on the carbon nanotube layer 147 via electron beam evaporation, thermal chemical vapor deposition, or sputtering method. The catalyst particles 148 can form as a catalyst layer in a thickness ranging from about 2 nm to about 500 nm. A material of the catalyst particle 148 can be Fe, Co, Ni, or any alloy of them. A diameter of the catalyst particle 148 ranges from about 5 nm to about 10 nm. The plurality of catalyst particles 148 is uniformly dispersed in the carbon nanotube layer 147. The plurality of catalyst particles 148 can be uniformly attached and dispersed on the surface of the plurality of carbon nanotubes via van der Waals force. The plurality of catalyst particles 148 can also be fixed in the plurality of apertures 142, thus the aggregation of the plurality of catalyst particles 148 can be avoided. While the diameter of the catalyst particle 148 is greater than the size of the aperture 142, the catalyst particle 148 can be partly fixed in the aperture 142. While the diameter of the catalyst particle 148 is substantially equal to the size of the aperture 142, the catalyst particle 148 can be embedded in to the aperture 142. In one embodiment, a material of the catalyst particle is about 8 nm, and the thickness of the catalyst layer is about 5 nm.

Figure 9:
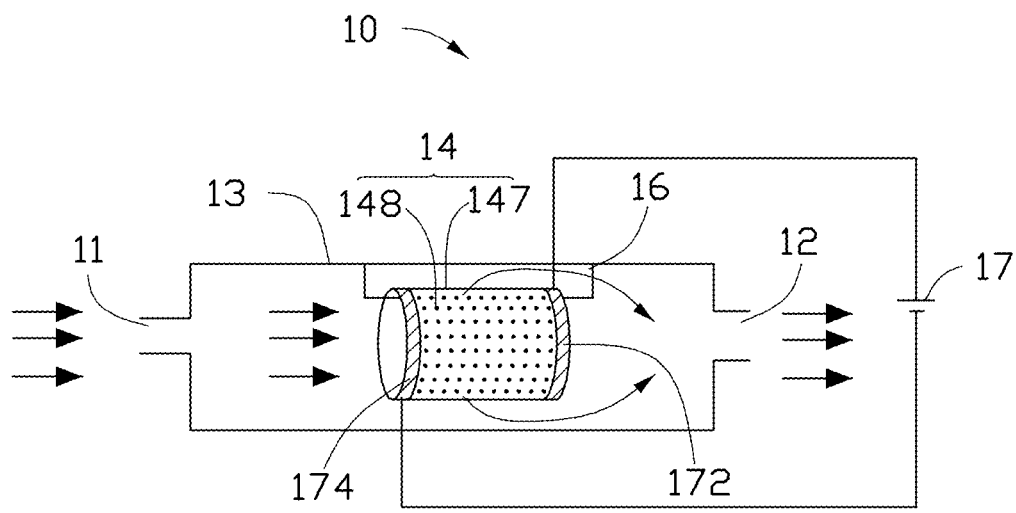
FIG. 9 is a schematic view of one embodiment of growing carbon nanotube using the reactor of FIG. 1.
Figure 10:
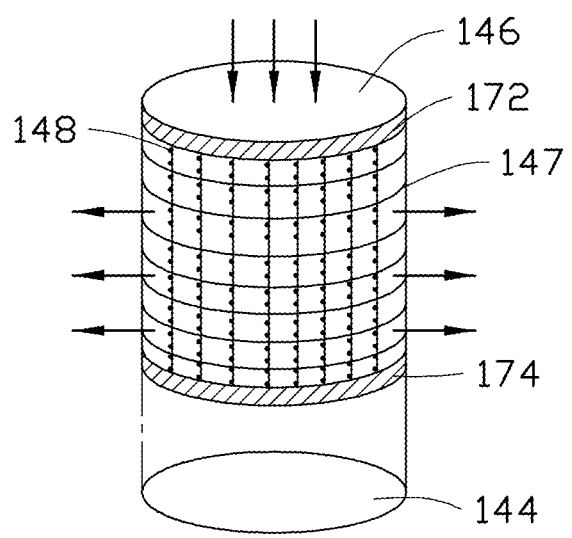
FIG. 10 shows a schematic view of gases flowing in the substrate.

Referring to FIGS. 9 and 10, a method of growing carbon nanotube with the reactor 10 including following steps:

(S11) providing the reactor 10;
(S12) introducing a mixture of a carbon source gas and a carrier gas into the reactor chamber 13; and
(S13) heating the substrate 14 in the reactor 10 to grow carbon nanotubes.

In step (S12), the mixture is introduced into the reactor chamber 13 through the inlet 11. The mixture flows in the substrate 14 will be blocked by the bottom 144, and the mixture will penetrate the sidewall 140. In one embodiment, the flow direction of the mixture is substantially perpendicular to the sidewall 140. Thus the carbon source gas can be completely reacted with the catalyst particles 148, and the quality of the carbon nanotubes grown in the reactor 10 will be improved. Furthermore, the plurality of catalyst particles 148 is firmly fixed in the carbon nanotube layer 147, thus the flow of the gases cannot affect the distribution of the plurality of catalyst particles 148. Therefore the aggregation of the plurality of catalyst particles 148 can be effectively prevented. Furthermore, the mixture flows out of the reactor chamber 13 through the outlet 12. A flow speed of the mixture introducing into the reactor chamber 13 is substantially equal to a flow speed of the mixture flow out of the chamber 13. Therefore, the carbon source gas in the reactor chamber can be updated to maintain density of the carbon source gas. The growing speed of the carbon nanotubes is dependent on the ratio between the temperature of the plurality of catalyst particles 148 and the temperature of the reactor 10. Therefore, the growing speed of the carbon nanotubes can be controlled via controlling the flow speed and pressure of the mixture, ensuring that the flow speed and pressure of the mixture cannot break the substrate 15.

The carrier gas can be a noble gas, nitrogen, or hydrogen. The carrier gas can also be used to adjust the pressure of the furnace 19. The carbon source gas can be a hydrocarbon such as methane, acetylene, ethylene or ethane. The ratio of the carbon source gas and the protective gas can be about 1:1 to about 5:1. In one embodiment, the carrier gas is argon and can be introduced at a flow rate of 100 sccm. The carbon source gas is ethylene and can be introduced at a flow rate of 1000 sccm.

In step (S13), the reactor chamber 13 can be heated to a reaction temperature to grow carbon nanotubes via a heating device (not shown). In one embodiment, the reactor chamber 13 can be heated by introducing an electric current into the carbon nanotube layer 147 via a first electrode 172 and a second electrode 174. The first electrode 172 and the second electrode 174 are spaced from each other and electrically connected to the carbon nanotube layer 147. In one embodiment, the first electrode 172 is located adjacent to the opening 146, and the second electrode 174 is located adjacent to the bottom 144.

A voltage is applied between the first electrode 172 and the second electrode 174 via a power supply 17, and the electric current is introducing into the carbon nanotube layer 147. The carbon nanotube layer 147 can transfer electric energy to heat effectively. The voltage can be selected according to the length of the carbon nanotube layer 147 and the diameter of the carbon nanotubes. In one embodiment, the diameter of the carbon nanotubes is about 5 nanometers, and the voltage is about 40 V. During the process of heating the carbon nanotube layer 147, the temperature of the carbon nanotube layer 147 rapidly increases due to Joule-heating. The carbon nanotube layer 147 is heated to a temperature in a range from about 500° C. to about 900° C. Furthermore, the temperature of the reactor chamber 13 only ranges from about 30° C. to about 50° C. Thus a greater temperature difference is existed between the carbon nanotube layer 147 and the reactor chamber 13. Therefore, the growing speed of the carbon nanotubes on the carbon nanotube layer 147 can be improved. The reacting time ranges from about 30 minutes to about 60 minutes.

Furthermore, during the process of applying a voltage to the carbon nanotube layer 147, a heating device (not shown)

can be used to heat the reactor chamber 13 to increase the growing speed of the carbon nanotubes.

The reactor 10 has the following advantages. First, due to the chemical stability of the carbon nanotube layer 147, the carbon nanotubes in the carbon nanotube layer 147 cannot react with the catalyst particles 148. Second, the carbon nanotubes in the carbon nanotube layer 147 have large surface area, thus the carbon nanotubes have great attractive force, and the catalyst particles 148 can be directly and firmly fixed on the surface of carbon nanotubes, the additive can be avoided. Third, the carbon nanotube layer 147 defines the plurality of apertures 142, thus the catalyst particles 148 can be effectively embedded into the plurality of apertures 142, and aggregation and deactivation of the catalyst particles 148 during growing process can be prevented. Fourth, the carbon nanotube layer 147 can transfer electric energy to heat effectively, and the reactor chamber 13 can be heated by directly intruding an electric current into the carbon nanotube layer 147, thus the heating device can be avoided.

Figure 11:
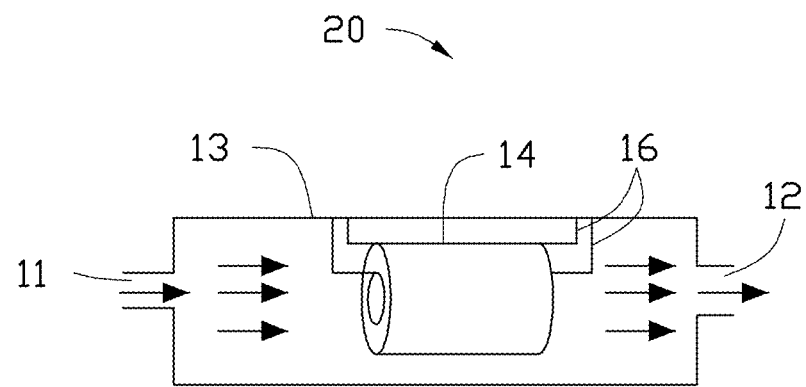
FIG. 11 is a schematic view of one embodiment of growing carbon nanotube.
Figure 12:
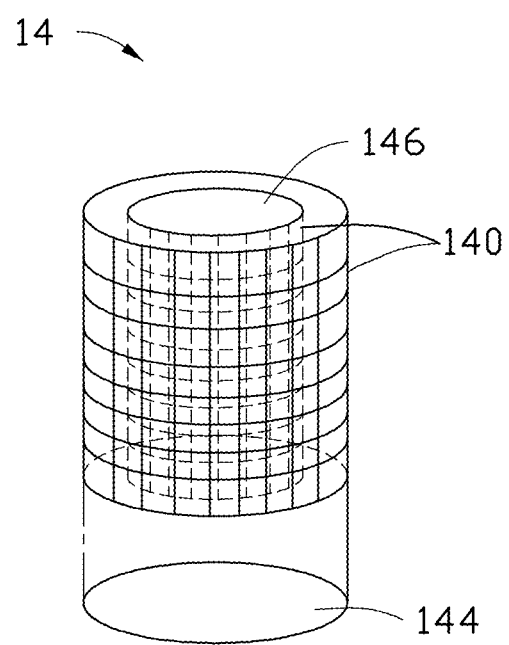
FIG. 12 shows a schematic view of a substrate in the reactor of FIG. 11.

Referring to FIGS. 11-12, a reactor 20 of one embodiment includes a reactor chamber 13, and a substrate 14 located in the reactor chamber 13. The reactor chamber 13 includes an inlet 11 and an outlet 12 on the two opposite ends of the reactor chamber 13. The substrate 14 includes a plurality of sidewalls 140, a bottom 144, and defines an opening 146. The plurality of sidewalls 140 and the bottom 144 form a semi-closed structure. The plurality of sidewalls 140 can be spaced from each other and coaxial. Each of the plurality of sidewalls 140 is surrounded by another adjacent sidewall 140. The structure of reactor 20 is similar to the structure of reactor 10, except that the substrate 14 includes a plurality of sidewalls 140.

Also referring to FIG. 12, the plurality of sidewalls 140 can be sealed by one bottom 144. In one embodiment, the substrate 14 includes two layers of sidewalls 140 spaced from each other. The distance between adjacent two sidewalls 140 can be same or different. The opening 146 is defined by the plurality of sidewalls 140. In one embodiment, the plurality of sidewalls is spaced with a certain distance. The distance can range from about 0.5 centimeters to about 2 centimeters. The plurality of sidewalls 140 can be heated at the same time, or selectively heated.

The reactor 20 has following advantages. First, the carbon nanotubes can be grown on the plurality of sidewalls 140 at the same time, thus the productivity can be improved. Second, carbon source gas can successively flow though the plurality of sidewalls 140, thus the carbon source gas can be effectively reacted with the carbon nanotube catalyst particles. Third, the plurality of sidewalls 140 can be independently controlled. Even if one of the plurality of sidewalls 140 cannot work normally, the other sidewalls 140 can still work, thus the lifespan of the reactor 20 can be prolonged.

Depending on the embodiment, certain of the steps of methods described may be removed, others may be added, and that order of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

What is claimed is:

1. A reactor comprising:
   a reactor chamber comprising an inlet and an outlet;
   a hollow structure received in the reactor chamber, the hollow structure comprising a sidewall, a bottom, and defining an opening opposite to the bottom, wherein the sidewall comprises a plurality of apertures to facilitate gases to flow through the plurality of apertures from the inlet to the out let of the reactor chamber, the hollow structure comprises a carbon nanotube layer, the carbon nanotube layer defines the plurality of apertures, a plurality of catalyst particles are embedded into the plurality of apertures, and a diameter of one of the plurality of catalyst particles is substantially equal to a size of one of the plurality of apertures in which the one of the plurality catalyst particles is embedded, wherein the hollow structure is suspended in the reactor chamber and spaced from an inner wall of the reactor chamber;
   a first electrode and a second electrode, wherein the first electrode and the second electrode are spaced from each other and electrically connected to the hollow structure, the first electrode and the second electrode are on in direct contact with an outer surface and surround the outer surface of the hollow structure; and
   a power supply electrically connected to the first electrode and the second electrode and configured to supply a voltage between the first electrode and the second electrode to introduce an electric current into the carbon nanotube layer.

2. The reactor of claim 1, wherein the opening faces the inlet to introduce gases.

3. The reactor of claim 1, wherein the hollow structure has a configuration of a bucket, and a longitudinal axis of the bucket extends from the inlet to the outlet.

4. The reactor of claim 1, wherein the plurality of catalyst particles are dispersed in the carbon nanotube layer.

5. The reactor of claim 4, wherein the carbon nanotube layer is a free-standing structure and forms the hollow structure, and the plurality of catalyst particles are directly attached on a surface of the carbon nanotube layer.

6. The reactor of claim 4, wherein a size of each of the plurality of apertures ranges from about 5 nanometers to about 10 nanometers.

7. The reactor of claim 4, wherein the carbon nanotube layer comprises at least one carbon nanotube film, and the at least one carbon nanotube film comprises a plurality of carbon nanotubes oriented substantially along an alignment direction.

8. The reactor of claim 7, wherein the carbon nanotube layer comprises at least two carbon nanotube films stacked on each other, an angle between the alignment directions of the carbon nanotubes in adjacent of the at least two carbon nanotube films ranges from about 0 degrees to about 90 degrees.

9. The reactor of claim 8, wherein the carbon nanotube layer is configured to be heated to a temperature in a range from about 500° C. to about 900° C. to by introducing an electric current into the carbon nanotube layer via the first electrode and the second electrode.

10. The reactor of claim 1, wherein the hollow structure is suspended in the reactor chamber by a support fixed on the inner wall of the reactor chamber.

11. The reactor of claim 1, wherein the hollow structure comprises multiple sub-structures, the multiple sub-structure are hollow, spaced from each other, and coaxial, sidewalls and bottoms of each of the multiple sub-structures cooperatively form the sidewall and the bottom of the hollow structure, and the sidewalls of each of the multiple sub-structures comprises a carbon nanotube layer and a plurality of catalyst particles dispersed in the carbon nanotube layer.

12. The reactor of claim 11, wherein the multiple sub-structures are concentric.

13. The reactor of claim 11, wherein the multiple sub-structures are positioned such that the sidewalls of the multiple sub-structures are substantially evenly spaced.

14. The reactor of claim 1, wherein the first electrode is located adjacent to the opening, and the second electrode is located adjacent to the bottom.

15. A reactor comprising:
a reactor chamber comprising an inlet and an outlet;
a carbon nanotube composite layer received in the reactor chamber, wherein the carbon nanotube composite layer is a hollow structure with a sidewall, a bottom, and defining an opening opposite to the bottom, the sidewall comprises a plurality of apertures to facilitate gases to flow through the plurality of apertures from the inlet to the out let of the reactor chamber, the carbon nanotube composite layer comprises a carbon nanotube layer and a plurality of catalyst particles, the carbon nanotube layer defines the plurality of apertures, and the plurality of catalyst particles are embedded into the plurality of apertures; and
a first electrode and a second electrode, wherein the first electrode and the second electrode are spaced from each other and electrically connected to the carbon nanotube layer, the first electrode and the second electrode are in direct contact with an outer surface and surround the outer surface of the carbon nanotube layer; and
a power supply electrically connected to the first electrode and the second electrode and configured to supply a voltage between the first electrode and the second electrode to introduce an electric current into the carbon nanotube layer.

* * * * *